United States Patent
Xiao et al.

(10) Patent No.: US 12,543,306 B2
(45) Date of Patent: Feb. 3, 2026

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Deyuan Xiao, Hefei (CN); Guangsu Shao, Hefei (CN); Yunsong Qiu, Hefei (CN); Yi Jiang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 616 days.

(21) Appl. No.: 17/934,672

(22) Filed: Sep. 23, 2022

(65) Prior Publication Data

US 2023/0380146 A1  Nov. 23, 2023

Related U.S. Application Data

(63) Continuation of application No. PCT/CN2022/110262, filed on Aug. 4, 2022.

(30) Foreign Application Priority Data

May 20, 2022 (CN) .......................... 202210556179.3

(51) Int. Cl.
*H10B 12/00* (2023.01)
*H01L 23/528* (2006.01)

(52) U.S. Cl.
CPC ......... *H10B 12/488* (2023.02); *H01L 23/528* (2013.01); *H10B 12/05* (2023.02); *H10B 12/482* (2023.02)

(58) Field of Classification Search
CPC .... H10B 12/488; H10B 12/05; H10B 12/482; H01L 23/528
See application file for complete search history.

(56) References Cited

U.S. PATENT DOCUMENTS 8,293,604 B2  10/2012  Yoon et al.
8,309,416 B2  11/2012  Park et al.
(Continued)

FOREIGN PATENT DOCUMENTS

CN  102034759 A  4/2011
CN  113611671 A  11/2021
(Continued)

OTHER PUBLICATIONS

International Search Report cited in PCT/CN2022/110262 mailed Jan. 18, 2023, 9 pages.

*Primary Examiner* — Patricia D Valenzuela
(74) *Attorney, Agent, or Firm* — Kilpatrick Townsend & Stockton LLP

(57) ABSTRACT

The present disclosure provides a semiconductor structure and a manufacturing method thereof. The manufacturing method includes: providing a substrate, where the substrate includes first grooves arranged at intervals therein along a second direction and extended along a first direction, and a filling layer in the first groove; patterning the substrate, to form second grooves, where the second groove is located on a top surface of the first groove, forming a protective layer on a surface of the substrate, where the protective layer is different from the filling layer; forming a bit line structure at a bottom of the second groove; forming a first isolation layer, where the first isolation layer is located in the second groove and on a top surface of the bit line structure; partially removing the filling layer, where the retained filling layer is flush with an upper surface of the first isolation layer.

13 Claims, 10 Drawing Sheets

(56) References Cited

U.S. PATENT DOCUMENTS

| | | | |
|---|---|---|---|
| 2010/0285645 A1* | 11/2010 | Yoon | H10D 30/693 |
| | | | 257/E21.41 |
| 2011/0073925 A1* | 3/2011 | Park | H01L 21/28518 |
| | | | 257/306 |

FOREIGN PATENT DOCUMENTS

| | | | |
|---|---|---|---|
| CN | 114023744 A | 2/2022 | |
| CN | 114141712 A | 3/2022 | |
| CN | 114420644 A | 4/2022 | |

* cited by examiner

SEMICONDUCTOR STRUCTURE AND MANUFACTURING METHOD THEREOF

CROSS-REFERENCE TO RELATED APPLICATIONS

This is a continuation of International Application No. PCT/CN2022/110262, filed on Aug. 4, 2022, which claims the priority to Chinese Patent Application No. 202210556179.3, titled "SEMICONDUCTOR STRUCTURE AND MANUFACTURING METHOD THEREOF" and filed on May 20, 2022. The entire contents of International Application No. PCT/CN2022/110262 and Chinese Patent Application No. 202210556179.3 are incorporated herein by reference.

TECHNICAL FIELD

The present disclosure relates to, but is not limited to, a semiconductor structure and a manufacturing method thereof.

BACKGROUND

With the increasingly high integration density of the dynamic memory, while the arrangement manners of transistors in a dynamic memory array structure and the way to reduce the size of individual functional devices in the dynamic memory array structure are studied, it is necessary to consider the effect of small-scale functional devices on the overall electrical performance of the semiconductor structure.

When vertical gate-all-around (GAA) transistors are used as access transistors of the dynamic memory, the area occupied by the GAA transistors can reach $4F^2$ (F: the smallest pattern size available under given process conditions). In principle, this arrangement can improve the density and efficiency.

However, currently, it is necessary to improve the performance of semiconductor structures.

SUMMARY

An overview of the subject described in detail in the present disclosure is provided below. This overview is not intended to limit the protection scope of the claims.

The present disclosure provides a semiconductor structure and a manufacturing method thereof.

A first aspect of the present disclosure provides a method of manufacturing a semiconductor structure, including: providing a substrate, where the substrate includes first grooves arranged at intervals therein along a second direction and extended along a first direction, and a filling layer in the first groove; patterning the substrate, to form second grooves, where the second grooves are arranged at intervals along a first direction and extended along a second direction, and located on top surfaces of the first grooves, and the first groove and the second groove form a channel pillar structure; forming a protective layer on a surface of the substrate, where the protective layer is different from the filling layer; forming a bit line structure at a bottom of the second groove; forming a first isolation layer, where the first isolation layer is located in the second groove and on a top surface of the bit line structure; partially removing the filling layer, where the retained filling layer is flush with an upper surface of the first isolation layer; forming word line structures surrounding the channel pillar structures and distributed at intervals along the first direction and extended along a second direction; and forming an isolation structure, where the isolation structure is located in the second groove and between adjacent two of the word line structures.

A second aspect of the present disclosure provides a semiconductor structure, including: a substrate; channel pillar structures, where the channel pillar structures are located in the substrate and arranged at intervals along a first direction and a second direction; bit line structures, where the bit line structures communicate with the channel pillar structures, and are arranged at intervals in the substrate along the second direction and extended along the first direction, and located on bottom surfaces of the channel pillar structures; a first isolation layer, where the first isolation layer is located on a top surface of the bit line structure; a filling layer, where the filling layer is located in the substrate, and a top surface of the filling layer is flush with a top surface of the first isolation layer; word line structures surrounding the channel pillar structures and distributed at intervals along the first direction and extended along the second direction;

and an isolation structure, where the isolation structure is at least located between adjacent two of the word line structures.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may obtain other accompanying drawings based on these accompanying drawings without creative efforts.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

As can be seen from the background art, with the increasingly high integration density, to balance the size of the individual functional device in the semiconductor structure and the electrical performance of small-sized functional devices, it is necessary to provide a semiconductor structure and a manufacturing method thereof, thereby ensuring the integration density and meeting the performance requirement of the semiconductor structure.

In the method of manufacturing a semiconductor structure provided by embodiments of the present disclosure, the word line structure surrounding the channel pillar structure is formed to form the GAA transistor structure. The isolation structure is formed between adjacent word line structures, thereby avoiding the electrical connection between adjacent word lines, ensuring the integration density, and meeting the performance requirement of the semiconductor structure.

Figure 1:
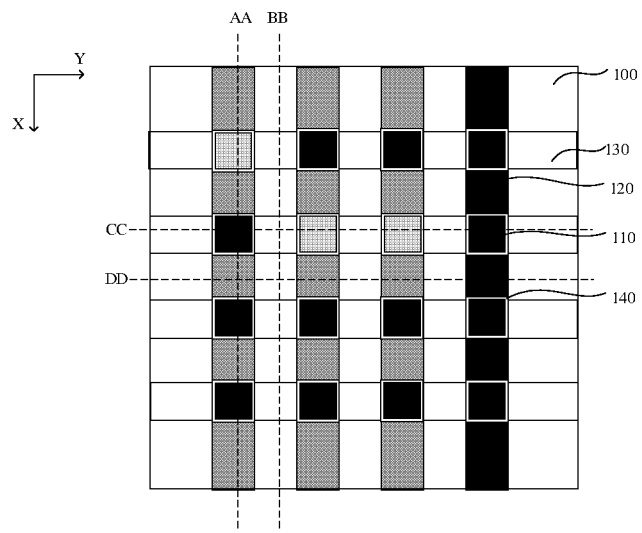
FIGS. 1 to 18 are schematic structural diagrams corresponding to steps of a method of manufacturing a semiconductor structure according to an embodiment of the present disclosure.

FIG. 1 is a top view of a semiconductor structure according to an embodiment of the present disclosure.

In some embodiments, the semiconductor structure includes: a substrate 100; channel pillar structures 110, where the channel pillar structures 110 are located in the substrate 100 and are arranged at intervals along a first direction X and a second direction Y; bit line structures 120, where the bit line structures 120 communicate with the channel pillar structures 110, and are arranged at intervals in the substrate 100 along the second direction Y and extended along the first direction X and located on bottom surfaces of the channel pillar structures 110; word line structures 130 surrounding the channel pillar structures 110 and distributed at intervals along the first direction X and extended along the second direction Y.

In some embodiments, a dielectric layer 140 is further formed around the channel pillar structure 110, and the dielectric layer 140 surrounds the channel pillar structure 110 by one circle to avoid direct contact between the channel pillar structure 110 and the word line structure 130.

A GAA structure can be formed by forming the word line structure 130 surrounding the channel pillar structure 110, thereby ensuring the integration density, and meeting the performance requirement of the semiconductor structure.

Figure 2:
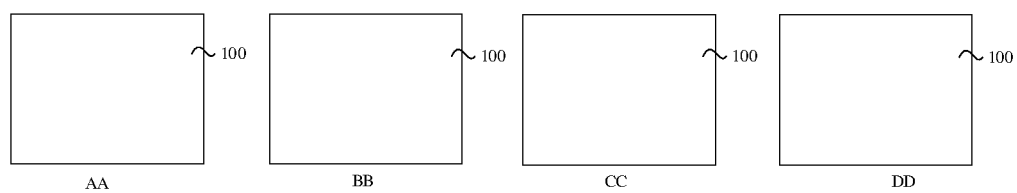
Figure 3:
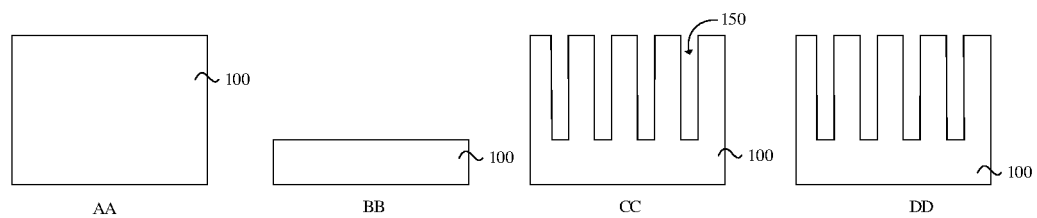
Figure 4:
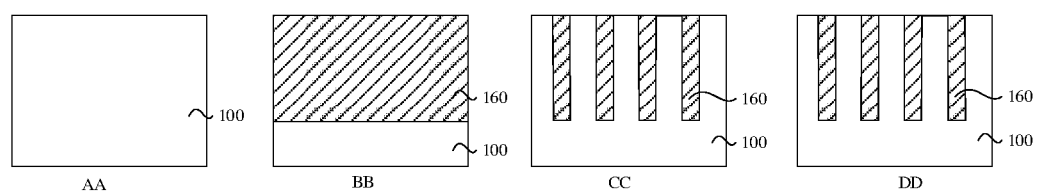

FIGS. 2 to 4 are cross-sectional views along a direction of a dotted line in FIG. 1 according to an embodiment of the present disclosure.

The substrate 100 is provided, and includes the first grooves 150 distributed in the substrate 100 at intervals along a second direction Y and extended along a first direction X, and the filling layer 160 located in the first groove 150.

In some embodiments, with reference to FIG. 3, the first groove 150 may be formed by a self-aligned double patterning (SADP) process, and in other embodiments, the first groove 150 may be formed by a self-aligned quadruple patterning (SAQP) process. The pattern of the first grooves 150 formed can be made more precise through the SADP or SAQP technology.

In some embodiments, the material of the substrate 100 may be silicon, germanium or silicon germanium, and the like. The substrate 100 made of, for example, silicon, may be doped with infinitesimal trivalent elements, such as, boron, indium, gallium, or aluminum, and the like, thereby forming a P-type base. Similarly, the substrate 100 is doped with infinitesimal pentavalent elements, such as, phosphorus, antimony, and arsenic, thereby forming an N-type base. The doped elements of the substrate 100 may be selected according to actual requirements and the product performance. The material of the substrate 100 and the doped elements are not limited in this present disclosure.

In some embodiments, with reference to FIG. 4, the material of the filling layer 160 may be an insulating material such as silicon oxide or silicon nitride.

In some embodiments, the filling layer 160 further covers the top surface of the substrate 100, and the filling layer 160 located on the top surface of the substrate 100 may be removed through chemical grinding to expose the top surface of the substrate 100.

With reference to FIGS. 5 to 12, the substrate 100 is patterned to form second grooves 170, and the second grooves 170 are arranged at intervals along the first direction X and extended along the second direction Y. The second groove 170 is located on the top surface of the first groove 150 (with reference to FIG. 3). The first groove 150 and the second groove 170 form the channel pillar structure 110. A protective layer 180 is formed on a surface of the substrate 100, and the protective layer 180 is different from the filling layer 160.

Figure 5:
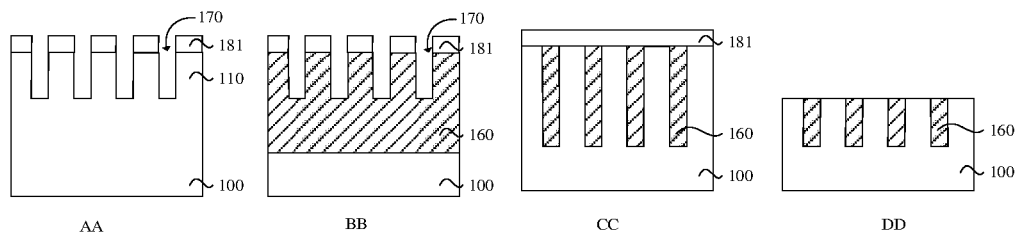

With reference to FIG. 5, a first protective layer 181 is formed, and the first protective layer 181 is located on the top surface of the substrate 100.

In some embodiments, the material of the first protective layer 181 may be silicon nitride, which is relatively hard. Therefore, in the subsequent step, the shape of the first protective layer 181 will not change greatly, such that the pattern formed is more accurate when the first protective layer 181 is used as a mask for subsequent patterning.

Figure 6:
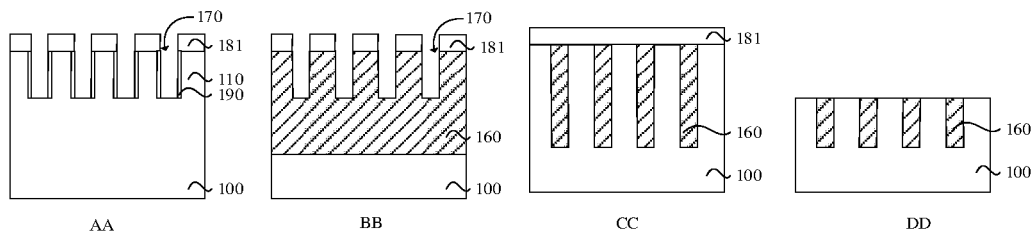

With reference to FIG. 6, a first dielectric layer 190 is formed on the sidewall of the channel pillar structure 110. In some embodiments, the first dielectric layer 190 may be formed by thermally oxidizing the channel pillar structure 110. The first dielectric layer 190 is configured to protect the channel pillar structure 110 when the bit line structure is subsequently formed.

In some embodiments, the first dielectric layer 190 is further located on the bottom surface of the second groove 170. The first dielectric layer 190 located on the bottom surface of the second groove 170 may be removed through etching back, to expose the surface of the substrate 100. By retaining the first dielectric layer 190 on the sidewall of the channel pillar structure 110, the channel pillar structure 110 can be protected from contamination when the bit line structure is subsequently formed.

Figure 7:
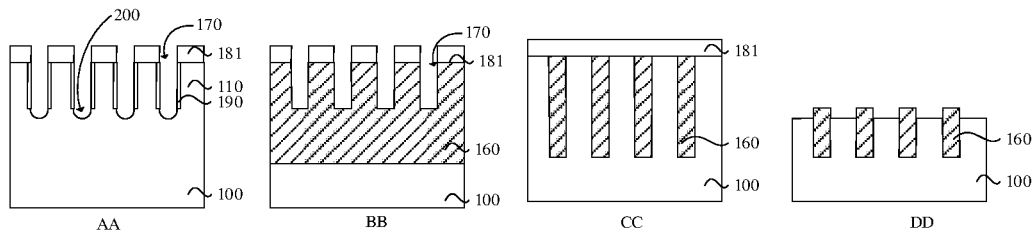
Figure 8:
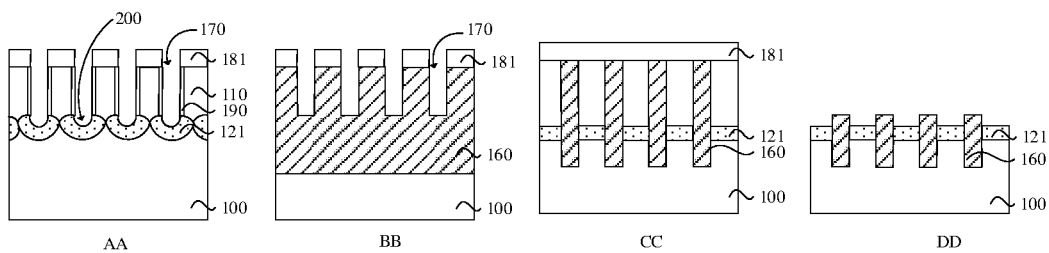
Figure 9:
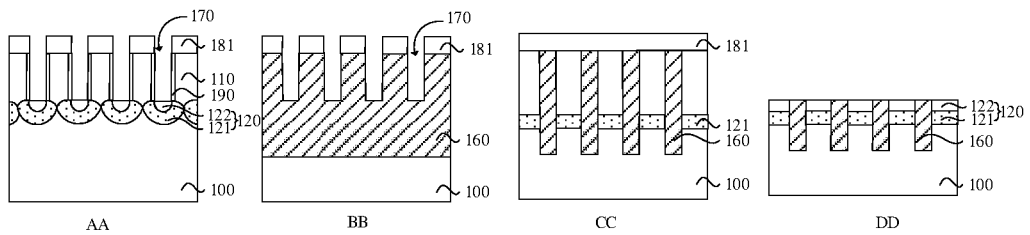

With reference to FIGS. 7 to 9, a bit line structure 120 is formed at the bottom of the second groove 170.

For example, with reference to FIG. 7, a fourth groove 200 is formed on the bottom surface of the second groove 170.

In some embodiments, the width of the fourth groove 200 along the first direction X may be greater than the spacing between adjacent channel pillar structures 110, such that a smaller part of the base material requires metal silicide when the bit line structure 120 is formed subsequently, to form a continuous first bit line conductive layer 121, thereby improving the transfer rate of the bit line structure 120. In some other embodiments, the width of the fourth groove 200 along the first direction X may be equal to the spacing between adjacent channel pillar structures 110.

In some embodiments, the shape of the cross-sectional view of the fourth groove 200 along the first direction X (with reference to FIG. 1) may be an ellipse or semi-circle. In some other embodiments, this shape may further be a rectangle.

With reference to FIG. 8, the first bit line conductive layer 121 is formed through a metal silicide process. The first bit line conductive layer 121 is located on the surface of the fourth groove 200 facing the substrate 100.

In some embodiments, a metal layer is formed on the surface of the substrate 100, and rapid thermal annealing treatment and selective wet etching treatment are performed, to form the first bit line conductive layer 121 in the substrate 100. The material of the metal layer may be metal such as titanium and cobalt. After the first bit line conductive layer 121 is formed, the metal layer is removed. The first bit line conductive layer 121 is formed by means of a metal silicide process, to reduce the resistance of the first bit line conductive layer 121.

With reference to FIG. 9, a second bit line conductive layer 122 is formed, where the second bit line conductive layer 122 fills up the fourth groove 200, and the first bit line conductive layer 121 and the second bit line conductive layer 122 form the bit line structure 120. The bit line structure 120 is located on the bottom surface of the first dielectric layer 190.

In some embodiments, the material of the second bit line conductive layer 122 may be metal. The material of the second bit line conductive layer 122 is set to be metal, to improve the conduction speed of the bit line structure 120, thereby improving the response speed of the semiconductor structure.

Figure 10:
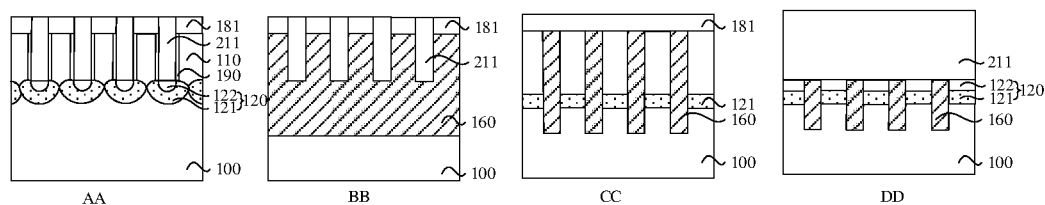
Figure 11:
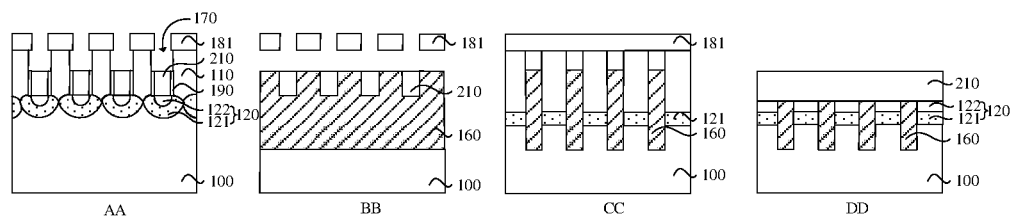

With reference to FIGS. 10 and 11, a first isolation layer 210 is formed.

For example, with reference to FIG. 10, a first initial isolation layer 211 is formed. In some embodiments, the first initial isolation layer 211 fills up the second groove 170 (with reference to FIG. 9), the first initial isolation layer 211 and the filling layer 160 may be made of a same material, thereby reducing the material types in the production process, and providing a basis for subsequently removing a part of the filling layer 160 and the first initial isolation layer 211 in a same step.

With reference to FIGS. 10 and 11, the first initial isolation layer 211 is patterned to form the first isolation layer 210. A part of the filling layer 160 is removed, and the remaining filling layer 160 is flush with an upper surface of the first isolation layer 210.

In some embodiments, with reference to FIGS. 10 and 11, when the first initial isolation layer 211 is patterned, the method further includes: patterning a part of the first dielectric layer 190, to expose an inner wall of a part of the second groove 170 (with reference to FIG. 9), and a top surface of the first dielectric layer 190 is flush with that of the first isolation layer 210.

In some embodiments, with reference to FIG. 11, before the protective layer 180 (with reference to FIG. 12) is formed, the first dielectric layer 190 and a part of the filling layer 160 may be removed in the same step. The top surface of the filling layer 160 is flush with that of the first dielectric layer 190.

In some embodiments, with reference to FIGS. 10 and 11, the first dielectric layer 190, the first isolation layer 210 and the filling layer 160 may be all made of silicon oxide, and therefore the first dielectric layer 190 and the filling layer 160 are removed partially when the first initial isolation layer 211 is patterned. In some other embodiments, the first dielectric layer 190, the first isolation layer 210, and the filling layer 160 are made of different materials, and therefore the three layers are patterned respectively until their top surfaces are flush with each other. The first dielectric layer 190, the first isolation layer 210, and the filling layer 160 are patterned, to provide a process basis for the subsequent formation of the word line structure.

Figure 12:
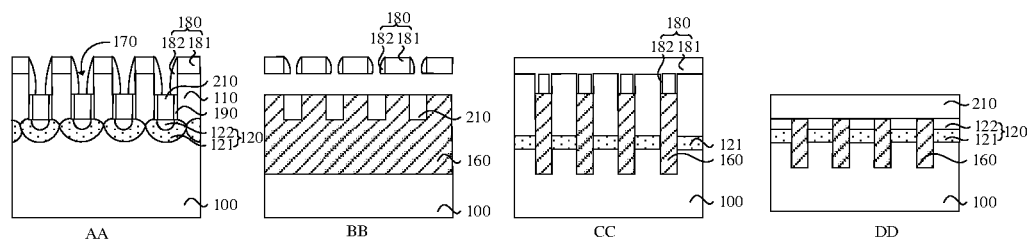

With reference to FIG. 12, a second protective layer 182 is formed, where the second protective layer 182 is located on an inner wall of the second groove 170 and a sidewall of the first protective layer 181, and the first protective layer 181 and the second protective layer 182 form the protective layer 180.

In some embodiments, the second protective layer 182 and the first protective layer 181 are made of a same material, which may be silicon nitride, and the second protective layer 182 may be formed by depositing silicon nitride.

In some embodiments, with reference to FIG. 12, in the process of depositing to form the second protective layer 182, the second protective layer 182 further covers the entire surface of the first isolation layer 210, and a part of the second protective layer 182 on the surface of the first isolation layer 210 may be removed through etching back to expose the first isolation layer 210.

With reference to FIGS. 13 to 16, a word line structure 130 is formed at the bottom of the second groove 170.

Figure 13:
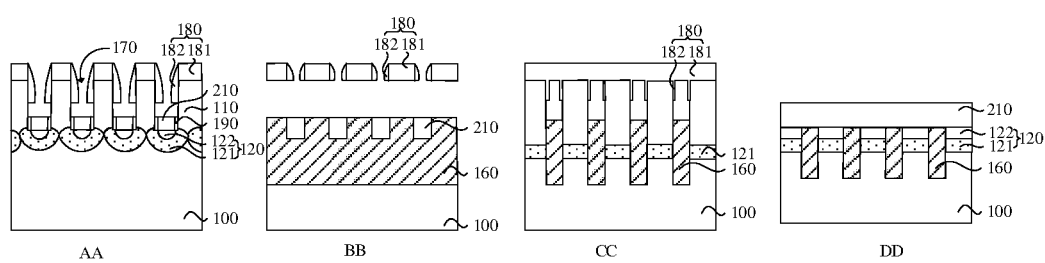

For example, with reference to FIG. 13, after the protective layer 180 is formed, the method further includes: removing the first dielectric layer 190 and a part of the filling layer 160 in the same step, where the remaining filling layer 160 is flush with the upper surface of the first isolation layer 210.

It can be understood that the first dielectric layer 190 and the filling layer 160 may be made of a same material, and therefore the first dielectric layer 190 and the filling layer 160 are partially removed in a same step, to reduce the process steps in the whole production process, and make the height difference between the retained first dielectric layer 190 and the filling layer 160 smaller, thereby increasing the reliability of the formed semiconductor structure.

Figure 14:
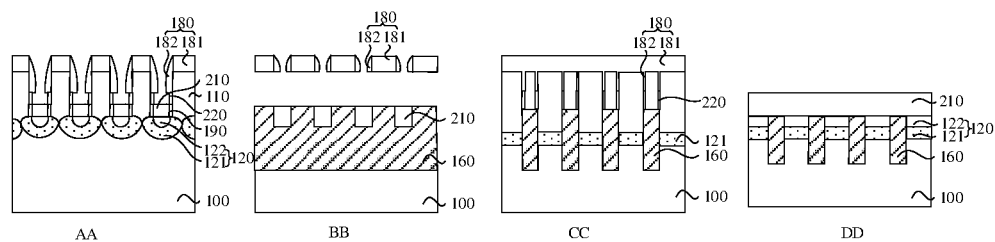

With reference to FIG. 14, a second dielectric layer 220 is formed, where the second dielectric layer 220 is located on the top surface of the first dielectric layer 190 and covers a part of the sidewall of the channel pillar structure 110.

In some embodiments, the second dielectric layer 220 may be formed by thermal oxidation. In other embodiments, the second dielectric layer 220 may further be formed through deposition. The second dielectric layer 220 may serve as the dielectric layer 140 (with reference to FIG. 1), such that the direct contact between the word line structure and the channel pillar structure 110 can be avoided.

Figure 15:
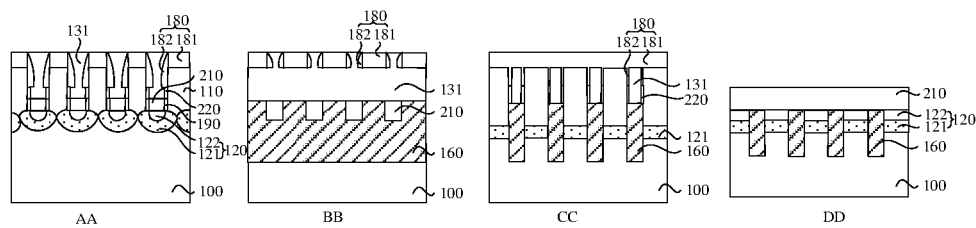

With reference to FIG. 15, an initial word line structure 131 is formed, where the initial word line structure 131 fills up the first groove 150 and the second groove 170.

In some embodiments, the material of the initial word line structure 131 may be a metal material such as tungsten, and the transmission rate of the word line structure can be improved by setting the material of the initial word line structure 131 to be a metal material.

Figure 16:
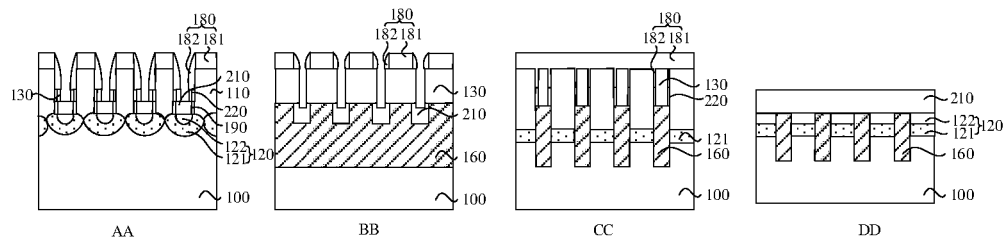

With reference to FIGS. 15 and 16, the initial word line structure 131 is patterned by using the protective layer 180 as a mask, until the top surface of the first isolation layer 210 is exposed, where the retained initial word line structure 131 is taken as the word line structure 130.

In some embodiments, the step of patterning the initial word line structure 131 includes: removing the initial word line structures 131 between the protective layers 180 and the initial word line structures 131 exposed by the protective layers 180, to form word line structures 130 distributed at intervals along the first direction X and extended along the second direction Y. It can be understood that the word line structures 130 include the word line structures 130 located on the sidewalls of the channel pillar structures 110 distributed along the second direction Y and the word line structures 130 between the channel pillar structures 110 distributed along the first direction X at intervals, to form the word line structures 130 surrounding the channel pillar structures 110, thereby improving the integration density of the semiconductor structure.

Figure 17:
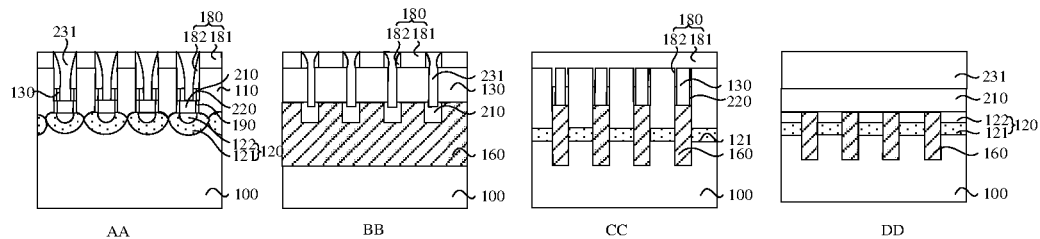
Figure 18:
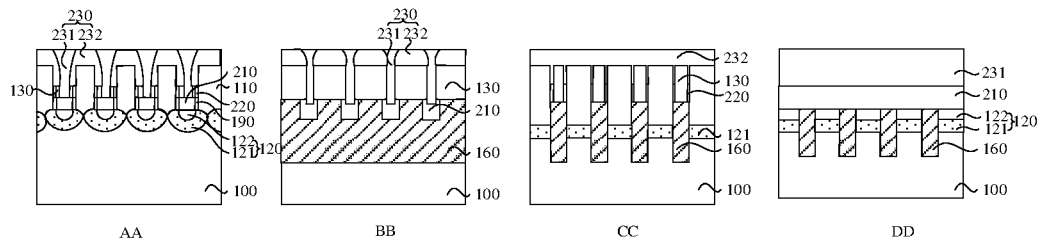

With reference to FIGS. 17 and 18, an isolation structure 230 is formed in the second groove 170 and between adjacent two of the word line structures.

With reference to FIG. 17, a first isolation structure 231 is formed on the top surface of the first isolation layer 210, a sidewall of the word line structures 130, and the sidewall of the protective layer 180. The first isolation structure 231 is formed to isolate adjacent word line structures 130, thereby avoiding the interference between adjacent word line structures 130, and improving the reliability of the semiconductor structure.

With reference to FIG. 18, the protective layer 180 (with reference to FIG. 17) is removed, to form a third groove (not shown in the figure). A second isolation structure 232 is formed and fills up the third groove. The first isolation structure 231 and the second isolation structure 232 form the isolation structure 230. In some embodiments, the protective layer 180 on the top surface of a cross section along a direction BB may be etched off, and then a corresponding material is deposited to form the second isolation structure 232. The second isolation structure 232 may be used as the protective layer for the word line structure 130, such that when the semiconductor structure is subjected to stress, the stress on the word line structure 130 is reduced, thereby improving the reliability of the semiconductor structure.

In the embodiments of the present disclosure, a word line structure 130 is formed surrounding the channel pillar structure 110 to form a GAA transistor structure. In addition, after the word line structures 130 are formed, isolation structures 230 are also formed between adjacent word line structures 130. The isolation structure 230 can increase the insulation between adjacent word line structures 130, to improve the performance of the semiconductor structure, thereby ensuring the performance of the semiconductor structure and improving the integration density thereof.

Another embodiment of the present disclosure further provides a method of manufacturing a semiconductor structure, which is substantially the same as that in the previous embodiment. Mainly, in the two embodiments, the methods for forming protective layers are different, and the structures of the protective layers are also different.

The method of manufacturing the semiconductor structure provided by the another embodiment of the present disclosure is described below with reference to the drawings. It should be noted that, for the parts the same as or corresponding to those mentioned in the foregoing embodiment, reference may be made to corresponding description of the foregoing embodiments, and details will not be described herein again.

With reference to FIGS. 19 to 30, FIG. 19 is a top view of a semiconductor structure according to an embodiment of the preset disclosure. FIGS. 20 to 30 are cross-sectional views along a dotted-line direction in FIG. 19.

Figure 19:
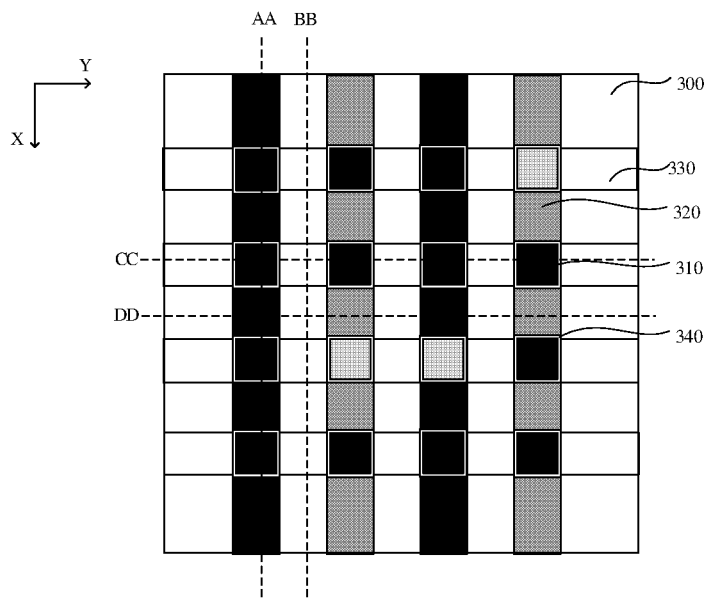
FIGS. 19 to 31 are schematic structural diagrams corresponding to steps of the method of manufacturing a semiconductor structure according to another embodiment of the present disclosure.

With reference to FIG. 19, the semiconductor structure includes: a substrate 300; channel pillar structures 310 spaced apart along a direction X and a second direction Y; bit line structures 320 extending along the first direction; word line structures 330 extending along the second direction Y; and a dielectric layer 340 surrounding a surface of the channel pillar structure 310.

Figure 20:
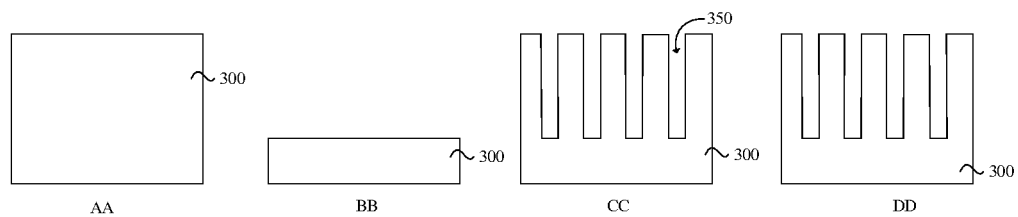

With reference to FIG. 20, a substrate 300 is provided and includes: first grooves 350 arranged at intervals along the second direction Y.

Figure 21:
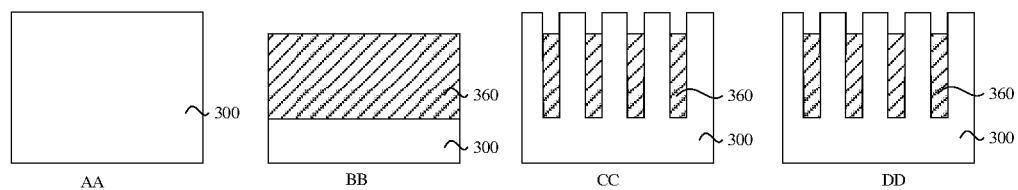

With reference to FIG. 21, a filling layer 360 is formed. Before the substrate 300 is patterned, the method further includes: partially removing the filling layer 360. Removing a part of the filling layer 360 provides a process basis for the subsequent formation of a first initial protective layer 383 (with reference to FIG. 23).

Figure 23:
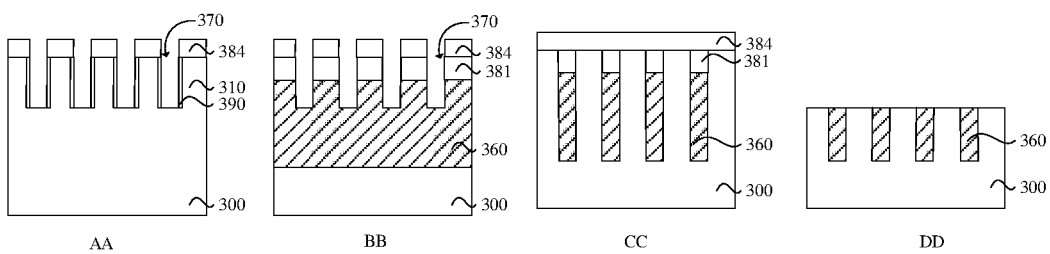

With reference to FIG. 23, a first protective layer 381 is formed on a top surface of the filling layer 360.

Figure 22:
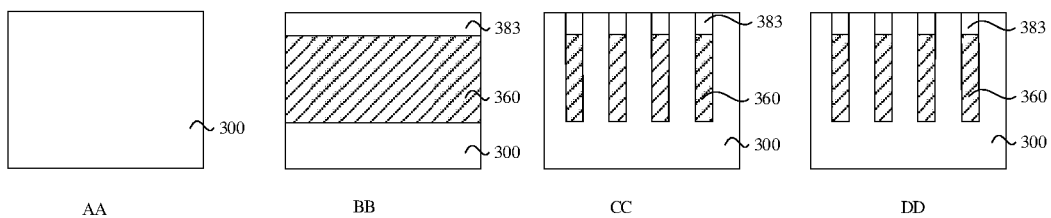

With reference to FIGS. 22 and 23, the first initial protective layer 383 and the substrate 300 are patterned, to form a second groove 370, where the retained first initial protective layer 383 is taken as a first protective layer 381. The first groove 350 (with reference to FIG. 20) and the second groove 370 define the channel pillar structure 310. In some embodiments, with reference to FIG. 23, before the first initial protective layer 383 is formed, a mask layer 384 is formed. The mask layer 384 and the first initial protective layer 383 may be made of a same material.

Figure 24:
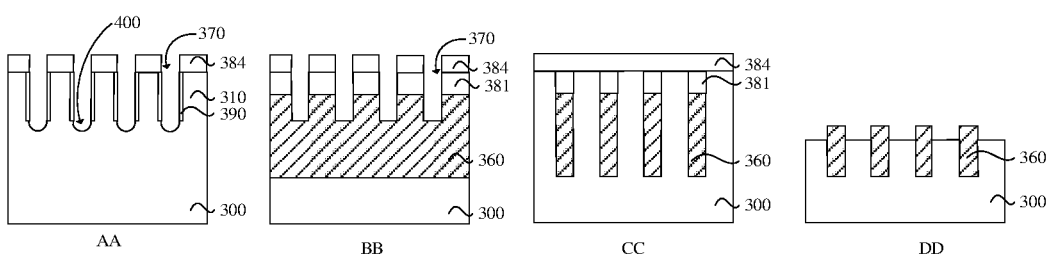

With reference to FIG. 24, after the second groove 370 is formed, the manufacturing method further includes: a first dielectric layer 390, where the first dielectric layer 390 is located on a sidewall of the channel pillar structure 310, such that the first dielectric layer 390 protects the channel pillar structure 310 from being affected when the bit line structure is formed subsequently.

With reference to FIG. 24, a fourth groove 400 is formed on a bottom surface of the second groove 370, to provide a space and a process basis for the bit line structure formed subsequently.

Figure 25:
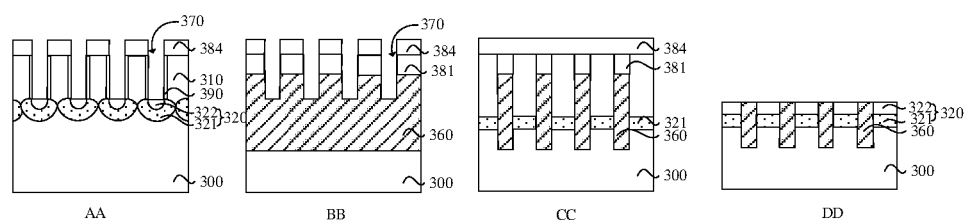

With reference to FIGS. 24 and 25, a first bit line conductive layer 321 is formed through a metal silicide process, where the first bit line conductive layer 321 is located on a surface of the fourth groove 400 facing the substrate 300; and a second bit line conductive layer 322 is formed, where the second bit line conductive layer 322 fills up the fourth groove 400, and the first bit line conductive layer 321 and the second bit line conductive layer 322 form the bit line structure 320. The first bit line conductive layer 321 is formed by means of a metal silicide process, to reduce the resistance of the first bit line conductive layer 321. The contact resistance between the bit line structure 320 and the substrate 300 can be reduced by forming the second bit line conductive layer 322. The bit line structure 320 is located on the bottom surface of the first dielectric layer 390.

Figure 26:
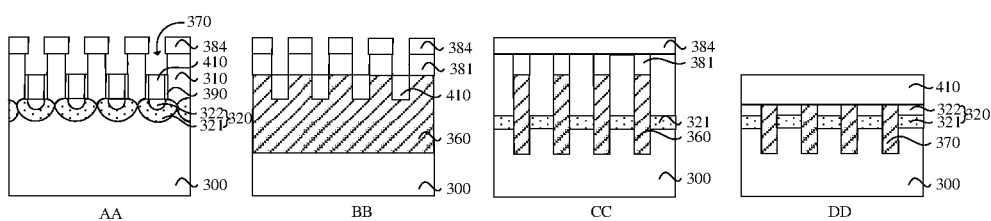

With reference to FIG. 26, a first isolation layer 410 is formed, where the first isolation layer 410 is located in the second groove 370 and on a top surface of the bit line structure 320. In some embodiments, the second groove 370 is filled up first, and then the first isolation layer 410 is formed through etching back.

Figure 27:
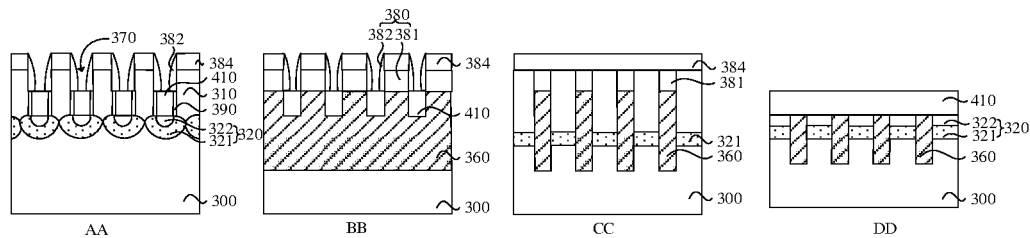

With reference to FIG. 27, a second protective layer 382 is formed, where the second protective layer 382 is located on an inner wall of the second groove 370 and a sidewall of the first protective layer 381, and the first protective layer 381 and the second protective layer 382 form the protective layer 380. The protective layer 380 may be used as a part of the isolation structure and may be further used as a mask for the subsequent formation of the word line structure.

In some embodiments, with reference to FIG. 27, the second protective layer 382 is further located on the sidewall of the mask layer 384.

Figure 28:
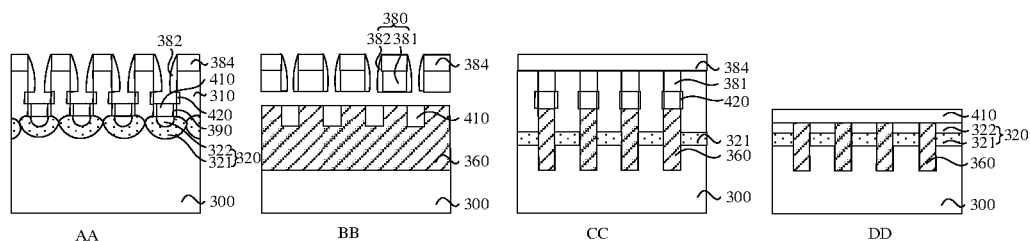

With reference to FIG. 28, in some embodiments, after the protective layer 380 is formed, and before the initial word line structure is formed, the step of removing a part of the filling layer 360 may further include: removing a part of the filling layer 360. Partially removing the filling layer 360 provides a process basis and a space to form an initial word line structure.

In some embodiments, with reference to FIG. 28, after the filling layer 360 is removed, the method further includes: forming a second dielectric layer 420. In some embodiments, the second dielectric layer 420 may be formed by partially oxidizing the channel pillar structure 310. The second dielectric layer 420 is located in the channel pillar structure 310. In another embodiment, the second dielectric layer may be formed through deposition, and located on the sidewall of the channel pillar structure. The second dielectric layer 420 is configured to avoid direct contact between the word line structure and the channel pillar structure 310.

In some embodiments, the second dielectric layer 420 is a part of the dielectric layer 340 (with reference to FIG. 19).

Figure 29:
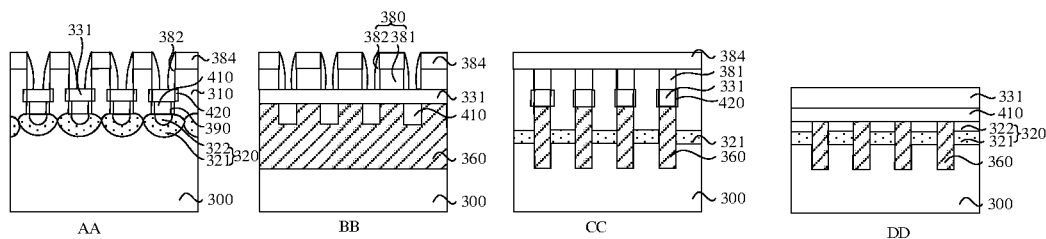

With reference to FIG. 29, an initial word line structure 331 is formed, where the initial word line structure 331 is located on a top surface of the first dielectric layer 390, a top surface of the first isolation layer 410, and a bottom surface of the protective layer 380.

Figure 30:
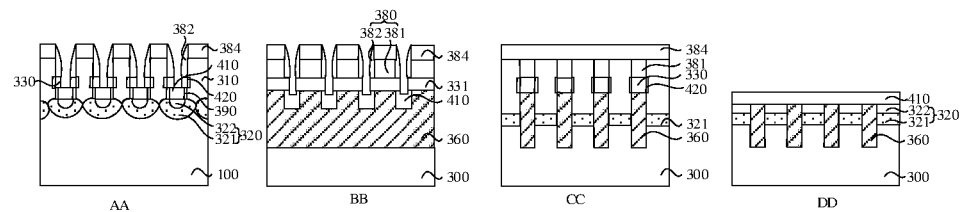

With reference to FIG. 30, the initial word line structure 331 is patterned by using the protective layer 380 as a mask, until the top surface of the first isolation layer 410 is exposed, where the retained initial word line structure 331 is taken as the word line structure 330. The word line structures 330 include the word line structures 330 located on the sidewalls of the channel pillar structures 310 distributed along the second direction Y and the word line structures 330 between the channel pillar structures 310 arranged at intervals along the first direction X, to form the word line structures 330 surrounding the channel pillar structures 310, thereby improving the integration density of the semiconductor structure.

Figure 31:
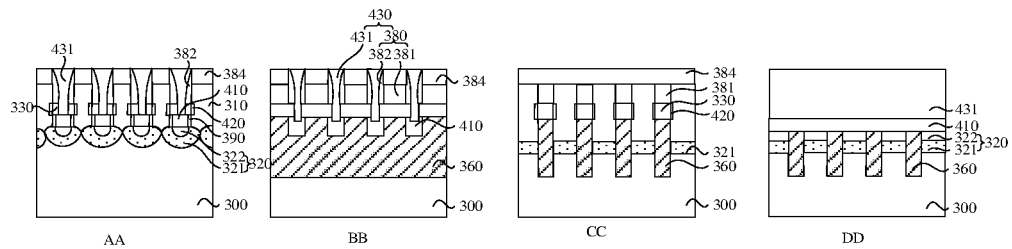

With reference to FIG. 31, the step of forming the isolation structure 430 may include: forming a first isolation structure 431 on the top surface of the first isolation layer 410, a sidewall of the word line structure 330, a sidewall of the protective layer 380, where the first isolation structure 431 and the protective layer 380 form the isolation structure 430. The isolation structure 430 is formed to isolate the word line structure 330 from the outside, thereby protecting the word line structure 330, to reduce the stress on the word line structure 130, and improving the reliability of semiconductor structures.

In some embodiments, with reference to FIG. 31, the mask layer 384 may further be used as a part of isolation structure 430.

In this embodiment of the present disclosure, before the channel pillar structure 310 is formed, the first initial protective layer 383 is formed first, and then the channel pillar structure 310 is formed. In this case, a partial top surface of the partial filling layer 360 includes a first protective layer 381, and then a second protective layer 382 is formed. The second protective layer 382 and the first protective layer 381 form the protective layer 380. In the subsequent process of forming the word line structure 330, the protective layer 380 may be used as a mask.

In the embodiments of the present disclosure, a word line structure 130 is formed surrounding the channel pillar structure 110 to form a GAA transistor structure, thereby ensuring the performance of the semiconductor structure and improving the integration density thereof.

Another embodiment of the present disclosure further provides a method of manufacturing a semiconductor structure, which is substantially the same as that in the previous embodiment. Mainly, in the two embodiments, the methods for forming protective layers are different, and the structures of the protective layers are also different. The method of manufacturing the semiconductor structure provided by the another embodiment of the present disclosure is described below with reference to the drawings. It should be noted that, for the parts the same as or corresponding to those mentioned in the foregoing embodiment, reference may be made to corresponding description of the foregoing embodiments, and details will not be described herein again.

With reference to FIGS. 32 to 40, FIG. 32 is a top view of a semiconductor structure according to an embodiment of the preset disclosure. FIGS. 33 to 40 are cross-sectional views along a dotted-line direction in FIG. 32.

Figure 32:
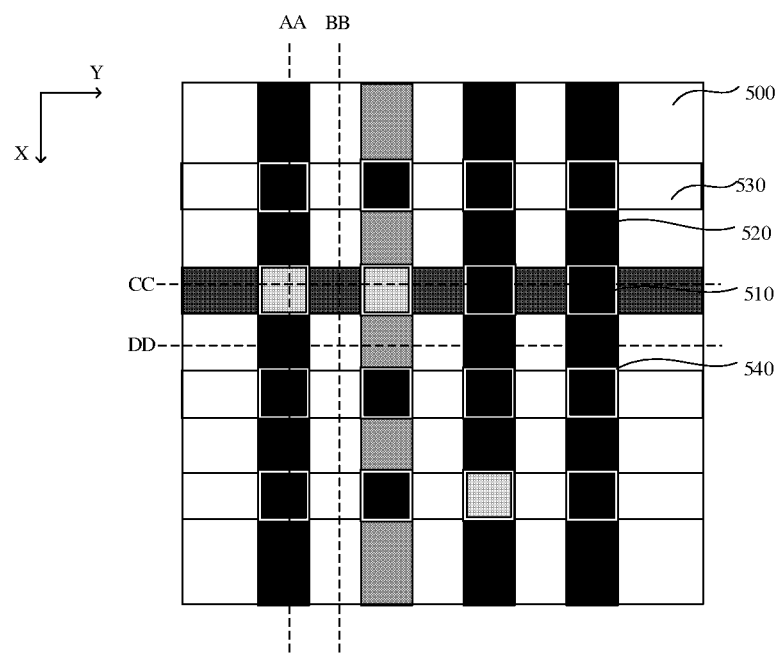
FIGS. 32 to 40 are schematic structural diagrams corresponding to steps of the method of manufacturing a semiconductor structure according to another embodiment of the present disclosure.

With reference to FIG. 32, the semiconductor structure includes: a substrate 500; channel pillar structures 510 spaced apart along a direction X and a second direction Y; bit line structures 520 extending along the first direction X; word line structures 530 extending along the second direction Y; and a dielectric layer 540 surrounding a surface of the channel pillar structure.

Figure 33:
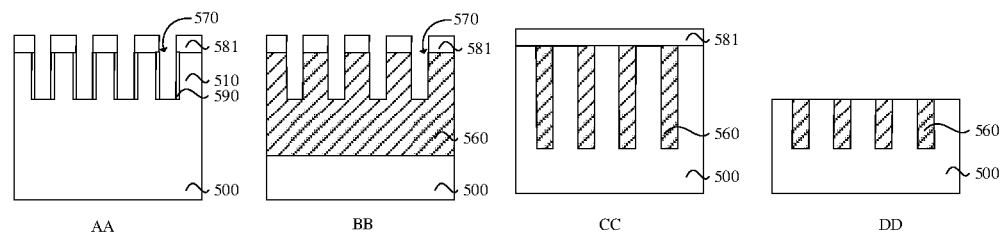

With reference to FIG. 33, a substrate 500 is provided and further includes a filling layer 560. The substrate 500 further includes second grooves 570 arranged at intervals along a first direction X (with reference to FIG. 32) and channel pillar structures 510 between second grooves 570.

In some embodiments, with reference to FIG. 33, the method of forming the protective layer may include: forming a first protective layer 581 at the top surface of the substrate 500.

Figure 34:
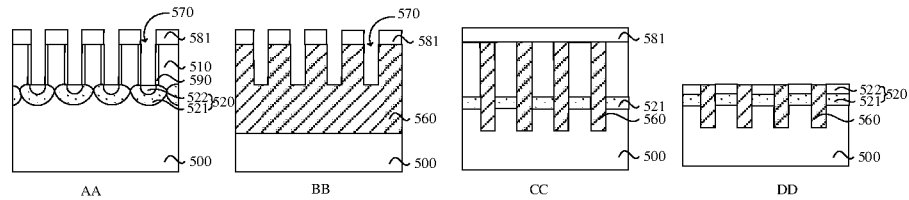

In some embodiments, with reference to FIG. 34, the method further includes a first dielectric layer 590 on the sidewall of the channel pillar structure 510. The first dielectric layer 590 is configured to protect the channel pillar structure 510 from being affected in the subsequent process of forming the bit line structure.

With reference to FIG. 34, the bit line structure 520 is formed. In some embodiments, the method for forming the bit line structure 520 may include: forming a fourth groove (not shown in the figure) on the bottom surface of the second groove 570. A first bit line conductive layer 521 is formed through a metal silicide process. The first bit line conductive layer 521 is located on a surface of the fourth groove facing the substrate 500. A second bit line conductive layer 522 is formed, where the second bit line conductive layer 522 fills up the fourth groove, and the first bit line conductive layer 521 and the second bit line conductive layer 522 form the bit line structure 520.

Forming the first bit line conductive layer 521 through the metal silicide process can reduce the resistance of the bit line structure 520. The contact resistance between the bit line structure 520 and the substrate 500 can be reduced by forming the second bit line conductive layer 522 filling up the fourth groove, thereby improving the property of the semiconductor structure.

Figure 35:
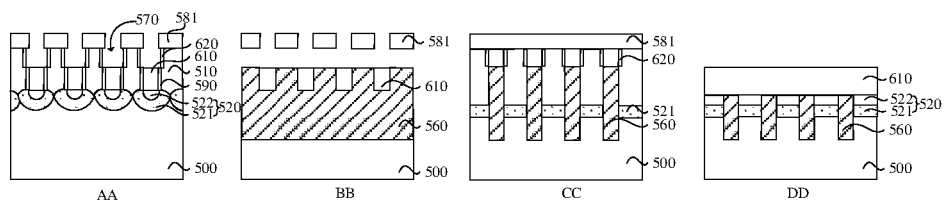

With reference to FIG. 35, a first isolation layer 610 is formed in the second groove 570, and the top surface of the first isolation layer 610 is lower than the bottom surface of the first protective layer 581. In some embodiments, to form the first isolation layer 610, a first initial isolation layer filling up the second groove 570 may be formed first, and then the first initial isolation layer is etched back to form the first isolation layer 610. When the first initial isolation layer is etched back, the method further includes: removing a part of the first dielectric layer 590 and the filling layer 560 in a same step, such that a top surface of the first dielectric layer 590 is flush with the upper surface of the first isolation layer 610.

With reference to FIG. 35, after the first isolation layer 610 is formed, the method further includes: forming a second dielectric layer 620, where the second dielectric layer 620 is located on the top surface of the first dielectric layer 590 and covers a part of the sidewall of the channel pillar structure 510. In some embodiments, the second dielectric layer 620 may be formed by thermally oxidizing a part of the sidewall of the channel pillar structure 510, such that the second dielectric layer 620 has a higher density and can be used as a dielectric layer 540 (with reference to FIG. 32).

Figure 36:
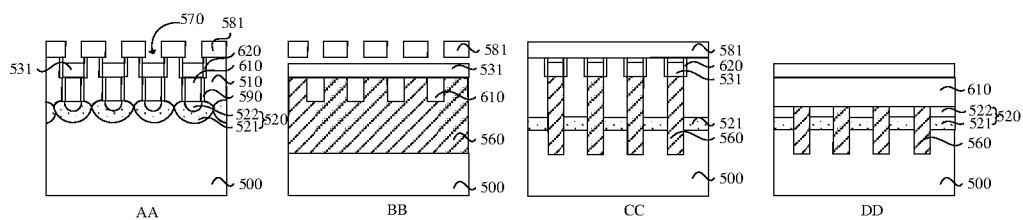
Figure 37:
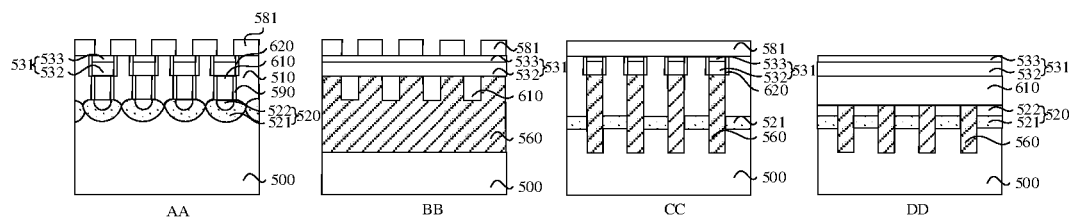

With reference to FIGS. 36 and 37, the initial word line structure 531 is formed and fills up the first groove and the second groove 570. The top surface of the initial word line structure 531 is flush with the bottom surface of the first protective layer 581.

In some embodiments, with reference to FIG. 37, the initial word line structure 531 includes a word line conductive layer 532 and a word line protective layer 533. The word line conductive layer 532 is configured to transmit signals, and the word line protective layer 533 is configured to protect the word line conductive layer 532.

Figure 38:
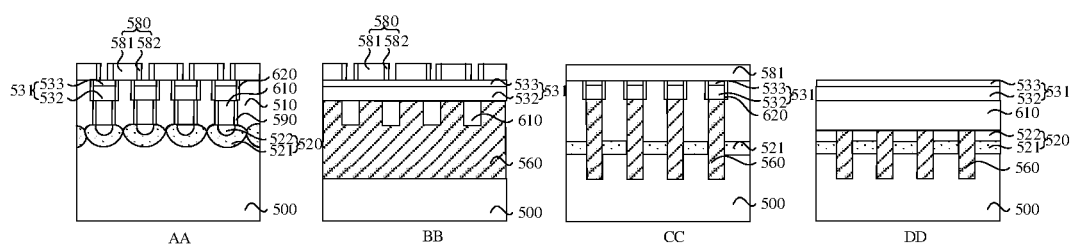

With reference to FIG. 38, a second protective layer 582 is formed on the sidewall of the first protective layer 581 and on the top surface of the second groove 570. The first protective layer 581 and the second protective layer 582 form the protective layer 580. The second protective layer 582 is formed to provide a mask for subsequent patterning of the initial word line structures 531, and the spacing between adjacent word line structures formed subsequently can be controlled by controlling the width of the second protective layer 582.

Figure 39:
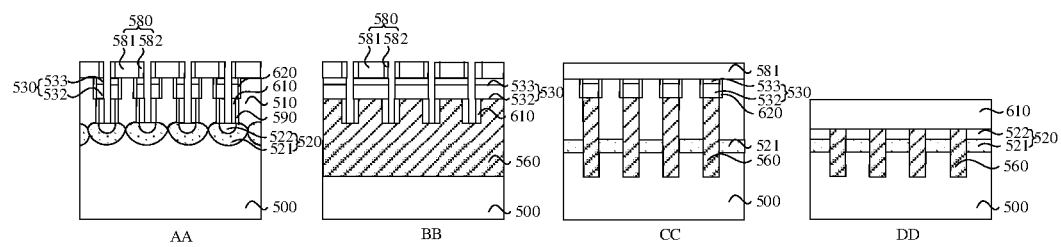

With reference to FIGS. 38 and 39, the initial word line structure 531 and the first isolation layer 610 are patterned by using the protective layer 580 as a mask until the top surface of the bit line structure 520 is exposed, and the remaining initial word line structure 531 is used as the word line structure 530. The initial word line structures 531 are patterned to form the word line structures 530 arranged at intervals, and provide a process basis for the subsequent formation of the isolation structures with air gaps.

Figure 40:
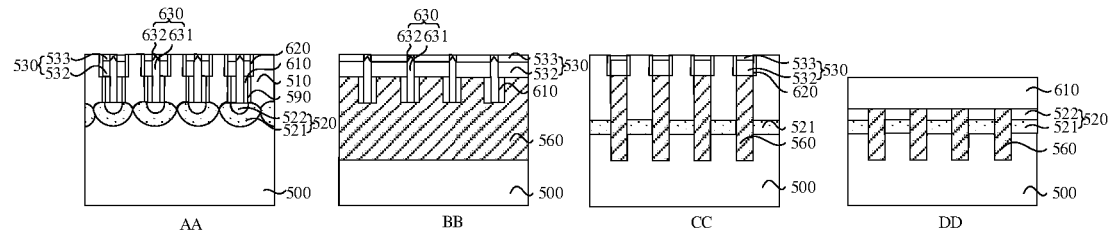

With reference to FIG. 40, a first isolation structure 631 and a second isolation structure 632 are formed. The first isolation structure 631 is an air gap defined by the first isolation layer 610, the word line structure 530, and the second isolation structure 632. The second isolation structure 632 is located between adjacent two of the word line structures 530, and a top surface of the second isolation structure 632 is flush with that of the word line structure 530. The isolation structure 630 with the air gap is formed, thereby reducing the parasitic capacitance between adjacent word line structures 530, such that the electrical performance of the semiconductor structure can be improved.

In the embodiment of the present disclosure, when the initial word line structure 531 is formed, the initial word line structure 531 filling up the first groove and the second groove 570 is formed, such that the protective layer 580 only located on the surface of the substrate 500 is formed when the second protective layer 582 is formed. In addition, when the isolation structure 630 is subsequently formed, the isolation structure 630 with the air gap is formed, thereby reducing the parasitic capacitance between adjacent word line structures 530.

In the embodiments of the present disclosure, a word line structure 530 is formed surrounding the channel pillar structure 510 to form a GAA transistor structure, thereby ensuring the performance of the semiconductor structure and improving the integration density thereof.

The embodiments of the present disclosure further provide a semiconductor structure, which can be formed by using the foregoing steps or all steps. The method of manufacturing the semiconductor structure provided by the another embodiment of the present disclosure is described below with reference to the drawings. It should be noted that, for the parts the same as or corresponding to those mentioned in the foregoing embodiment, reference may be made to corresponding description of the foregoing embodiments, and details will not be described herein again.

FIGS. 1, 19, and 32 are top views of a semiconductor structure according to various embodiments of the present disclosure. FIGS. 18, 29, and 36 are cross-sectional views along dotted-line directions in FIGS. 1, 19, and 32 according to various embodiments of the present disclosure.

For example, with reference to FIGS. 1 to 18, the semiconductor structure includes: a substrate 100; channel pillar structures 110, where the channel pillar structures 110 are located in the substrate 100 and are arranged at intervals along a first direction X and a second direction Y; bit line structures 120, where the bit line structures 120 communicate with the channel pillar structures 110, and are arranged at intervals in the substrate 100 along the second direction Y and extended along the first direction X, and located on bottom surfaces of the channel pillar structures 110; a first isolation layer 210, where the first isolation layer 210 is located on a top surface of the bit line structure 120; a filling layer 160, where the filling layer 160 is located in the substrate 100, and a top surface of the filling layer 160 is flush with that of the first isolation layer 210; word line structures 130 surrounding the channel pillar structures 110 and distributed at intervals along the first direction X and extended along the second direction Y; an isolation structure 230, where the isolation structure 230 is at least located between adjacent two of the word line structures 130; and a dielectric layer 140 surrounding a surface of the channel pillar structure 110.

A GAA transistor structure can be formed by setting the word line structure 130 to surround the channel pillar structure 110, thereby improving the integration density of the semiconductor structure and ensuring the performance of the semiconductor structure.

In some embodiments, the channel pillar structure 110 includes a first doped region, a channel region and a second doped region arranged in sequence. The first doped region is in contact with the bit line structure 120. The channel region and the second doped region are located between adjacent word line structures 130, and the three regions are doped with the same type of ions.

A junctionless transistor can be formed by doping the channel pillar structures 110 with the same type of ions, that is, the first doped region, the channel region and the second doped region are doped with the same type of ions such as the N-type ions. Further, the first doped region, the channel region and the second doped region may be doped with the same type of ions. The "junctionless" here refers to no PN junction, that is, there is no PN junction in the transistor formed by the channel pillar structure 110.

Because the device is a junctionless transistor, it avoids the use of an ultra-steep source/drain doping process to make an ultra-steep PN junction in a nanoscale range. Therefore, problems such as threshold voltage drift and leakage current increase caused by abrupt changes can be avoided, and the short channel effect can be easily suppressed, such that the device can still operate in the range of a few nanometers. Such a design further improves the integration density and electrical performance of the semiconductor structure. It can be understood that the additional doping herein refers to doping to make the type of the ions doped in the first doped region and the second doped region different from that of the ions doped in the channel region.

In some embodiments, with reference to FIG. 18, the bit line structure 120 includes a first bit line conductive layer 121, where the first bit line conductive layer 121 is located in the substrate 100 and is in contact with the bottom surface of the channel pillar structure 110; and a second bit line conductive layer 122 located on a top surface of the first bit line conductive layer 121. The first bit line conductive layer 121 can reduce the resistance of the bit line structure 120, and the second bit line conductive layer 122 can improve the transmission speed of the bit line structure 120.

In some embodiments, with reference to FIG. 18, the top surface of the second bit line conductive layer 122 is lower than the bottom surface of the channel pillar structure 110, and the bottom surface of the first isolation layer 210 is lower than the bottom surface of the channel pillar structure 110. In other words, the top surface of the second bit line conductive layer 122 is lower than the bottom surface of the channel pillar structure 110, and a part of the first isolation layer 210 is surrounded by the first bit line conductive layer 121, thereby increasing insulating properties between the word line structure 130 and the bit line structure 120.

In some embodiments, with reference to FIGS. 1 and 18, the semiconductor structure further includes a first dielectric layer 190 and a second dielectric layer 220. The first dielectric layer 190 is located on the sidewall of the channel pillar structure 110, and the second dielectric layer 220 is located on the first dielectric layer 190. The second dielectric layer 220 can be used as the dielectric layer 140 to avoid direct contact between the channel pillar structure 110 and the word line structure 130.

In some embodiments, with reference to FIG. 18, the isolation structure 230 includes: a first isolation structure 231, where the first isolation structure 231 is located on the top surface of the first isolation layer 210 and on the sidewall of the word line structure 130; and the second isolation structure 232, where the second isolation structure 232 is located on the top surface of the channel pillar structure 110 and between the channel pillar structure 110 and the first isolation structure 231. The first isolation structure 231 is formed to isolate adjacent word line structures 130, thereby avoiding the interference between adjacent word line structures 130, and improving the reliability of the semiconductor structure. The second isolation structure 232 is formed to reduce the stress on the word line structure 130, thereby improving the reliability of the semiconductor structure.

In the embodiments of the present disclosure, a word line structure 130 is formed surrounding the channel pillar structure 110 to form a GAA transistor structure. In addition, after the word line structures 130 are formed, isolation structures 230 are also formed between adjacent word line structures 130. The isolation structure 230 can increase the insulation between adjacent word line structures 130, to improve the performance of the semiconductor structure, thereby ensuring the performance of the semiconductor structure and improving the integration density thereof.

Another embodiment of the present disclosure further provides a semiconductor structure, which is substantially the same as that in the previous embodiment. Mainly, in the two embodiments, the isolation structures are different. The method of manufacturing the semiconductor structure provided by the another embodiment of the present disclosure is described below with reference to the drawings. It should be noted that, for the parts the same as or corresponding to those mentioned in the foregoing embodiment, reference may be made to corresponding description of the foregoing embodiments, and details will not be described herein again.

With reference to FIGS. 19 to 31, in the some other embodiments, the semiconductor structure includes: a substrate 300; channel pillar structures 310; bit line structures 320, where the bit line structures 320 communicate with the channel pillar structures 310; a first isolation layer 410, where the first isolation layer 410 is located on a top surface of the bit line structure 320; a filling layer 360, where the filling layer 360 is located in the substrate 300, and a top surface of the filling layer 360 is flush with that of the first isolation layer 410; word line structures 330 surrounding the channel pillar structures 310; an isolation structure 430, where the isolation structure 430 is at least located between adjacent two of the word line structures 330; and a dielectric layer 340 surrounding a surface of the channel pillar structure 310.

With reference to FIG. 31, the bit line structure 320 includes: a first bit line conductive layer 321, where the first bit line conductive layer 321 is located in the substrate 300, and is in contact with the bottom surface of the channel pillar structure 310; and the second bit line conductive layer 322 located on a top surface of the first bit line conductive layer 321.

In some embodiments, with reference to FIG. 31, the isolation structure 430 may include: a protective layer 380, where the protective layer 380 is located on a top surface and a partial sidewall of the channel pillar structure 310; and a first isolation structure 431, where the first isolation structure 431 is located on the top surface of the first isolation layer 410, a sidewall of the word line structure 330, and a sidewall of the protective layer 380. The isolation structure 430 is formed to isolate the word line structure 330 from the outside, thereby protecting the word line structure 330, to reduce the stress on the word line structure 330, and improving the reliability of semiconductor structures.

In some embodiments, with reference to FIG. 31, the protective layer 380 may include: a first protective layer 381 and a second protective layer 382.

In some embodiments, with reference to FIGS. 19 and 31, the semiconductor structure further includes a first dielectric layer 390 and a second dielectric layer 420. The first dielectric layer 390 is located on the sidewall of the channel pillar structure 310, and the second dielectric layer 420 is located on the first dielectric layer 390. The second dielectric layer 420 can be used as the dielectric layer 340 to avoid direct contact between the channel pillar structure 310 and the word line structure 330.

In some embodiments, with reference to FIG. 31, the semiconductor structure further includes: a mask layer 384, and the mask layer is located on the top surface of the channel pillar structure 310 to protect the channel pillar structure 310.

In the embodiments of the present disclosure, a word line structure 330 is formed surrounding the channel pillar structure 310 to form a GAA transistor structure, thereby ensuring the performance of the semiconductor structure and improving the integration density thereof.

Another embodiment of the present disclosure further provides a semiconductor structure, which is substantially the same as that in the previous embodiment. Mainly, in the two embodiments, the isolation structures are different. The method of manufacturing the semiconductor structure provided by the another embodiment of the present disclosure is described below with reference to the drawings. It should be noted that, for the parts the same as or corresponding to those mentioned in the foregoing embodiment, reference may be made to corresponding description of the foregoing embodiments, and details will not be described herein again.

With reference to FIGS. 32 to 40, in some other embodiments, the semiconductor structure includes: a substrate 500; channel pillar structures 510; bit line structures 520, where the bit line structures 520 communicate with the channel pillar structures 510; a first isolation layer 610, where the first isolation layer 610 is located on a top surface of the bit line structure 520; a filling layer 560, where the filling layer 560 is located in the substrate 500, and a top surface of the filling layer 560 is flush with that of the first isolation layer 610; word line structures 530 surrounding the channel pillar structures 510; an isolation structure 630, where the isolation structure 630 is at least located between adjacent two of the word line structures 530; and a dielectric layer 540 surrounding a surface of the channel pillar structure 510.

In some embodiments, with reference to FIG. 40, the isolation structure 630 includes a first isolation structure 631 and a second isolation structure 632. The first isolation structure 631 is an air gap defined by the first isolation layer 610, the word line structure 530, and the second isolation structure 632. The second isolation structure 632 is located between adjacent two of the word line structures 530, and a top surface of the second isolation structure 632 is flush with that of the word line structure 530. In this way, the parasitic capacitance between adjacent word line structures 530 can be reduced by setting the isolation structure 630 with the air gap.

In some embodiments, with reference to FIG. 40, the bit line structure 520 includes a first bit line conductive layer 521, where the first bit line conductive layer 521 is located in the substrate 500 and is in contact with the bottom surface of the channel pillar structure 510; and a second bit line conductive layer 522 located on a top surface of the first bit line conductive layer 521.

In some embodiments, with reference to FIG. 40, the word line structure 530 includes a word line conductive layer 532 and a word line protective layer 533 that are stacked.

With reference to FIG. 40, the semiconductor structure further includes a first dielectric layer 590 and a second dielectric layer 620. The first dielectric layer 590 is located on the sidewall of the channel pillar structure 510, and the second dielectric layer 620 is located on the first dielectric layer 590. The second dielectric layer 620 can be used as the dielectric layer 540 to avoid direct contact between the channel pillar structure 510 and the word line structure 530.

In the embodiments of the present disclosure, a word line structure 530 is formed surrounding the channel pillar structure 510 to form a GAA transistor structure, thereby ensuring the performance of the semiconductor structure and improving the integration density thereof.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In a semiconductor structure and a manufacturing method thereof provided by embodiments of the present disclosure, the word line structure surrounding the channel pillar structure is formed to form GAA transistor structures. After the word line structure is formed, the isolation structure is also formed between adjacent word line structures, thereby increasing the insulation between adjacent word lines, and improving the performance and density efficiency of the semiconductor structure.

The invention claimed is:
1. A method of manufacturing a semiconductor structure, comprising:
    providing a substrate, wherein the substrate comprises
        first grooves arranged at intervals therein along a second direction and extended along a first direction, and a filling layer in the first groove;

patterning the substrate, to form second grooves, wherein the second grooves are arranged at intervals along a first direction and extended along a second direction, and located on top surfaces of the first grooves, and the first groove and the second groove form a channel pillar structure;

forming a protective layer on a surface of the substrate, wherein the protective layer is different from the filling layer;

forming a bit line structure at a bottom of the second groove;

forming a first isolation layer, wherein the first isolation layer is located in the second groove and on a top surface of the bit line structure;

partially removing the filling layer, wherein the retained filling layer is flush with an upper surface of the first isolation layer;

forming word line structures surrounding the channel pillar structures and distributed at intervals along the first direction and extended along a second direction; and forming an isolation structure, wherein the isolation structure is located in the second groove and between adjacent two of the word line structures.

2. The method of manufacturing the semiconductor structure according to claim 1, further comprising: a first dielectric layer, wherein the first dielectric layer is located on the top surface of the bit line structure and on a sidewall of the channel pillar structure, and the forming a protective layer comprises:

forming a first protective layer, wherein the first protective layer is located on a top surface of the substrate;

partially patterning the first dielectric layer, to partially expose an inner wall of the second groove; and forming a second protective layer, wherein the second protective layer is located on the inner wall of the second groove and a sidewall of the first protective layer, and the first protective layer and the second protective layer form the protective layer.

3. The method of manufacturing the semiconductor structure according to claim 2, wherein the forming a word line structure comprises:

patterning the first dielectric layer after the protective layer is formed, such that a top surface of the first dielectric layer is flush with a top surface of the first isolation layer;

forming a second dielectric layer, wherein the second dielectric layer is located on the top surface of the first dielectric layer and covers a part of the sidewall of the channel pillar structure;

forming an initial word line structure, wherein the initial word line structure fills up the first groove and the second groove; and patterning the initial word line structure by using the protective layer as a mask, until the top surface of the first isolation layer is exposed, wherein the retained initial word line structure is taken as the word line structure.

4. The method of manufacturing the semiconductor structure according to claim 3, wherein the partially removing the filling layer comprises:

removing the first dielectric layer and a part of the filling layer in a same step before the protective layer is formed, wherein a top surface of the filling layer is flush with the top surface of the first dielectric layer; and removing the first dielectric layer and the part of the filling layer in the same step after the protective layer is formed, wherein the retained filling layer is flush with the upper surface of the first isolation layer.

5. The method of manufacturing the semiconductor structure according to claim 3, wherein the forming an isolation structure comprises:

forming a first isolation structure, wherein the first isolation structure is located on the top surface of the first isolation layer, a sidewall of the word line structure, and a sidewall of the protective layer;

removing the protective layer, to form a third groove; and forming a second isolation structure, wherein the second isolation structure fills up the third groove, and the first isolation structure and the second isolation structure form the isolation structure.

6. The method of manufacturing the semiconductor structure according to claim 1, wherein the forming a protective layer comprises:

partially removing the filling layer before patterning the substrate, and forming a first initial protective layer on a top surface of the filling layer;

patterning the first initial protective layer and the substrate, to form the second groove, wherein the retained first initial protective layer is taken as a first protective layer; and forming a second protective layer, wherein the second protective layer is located on an inner wall of the second groove and a sidewall of the first protective layer, and the first protective layer and the second protective layer form the protective layer.

7. The method of manufacturing the semiconductor structure according to claim 6, further comprising: a first dielectric layer, wherein the first dielectric layer is located on the top surface of the bit line structure and on a sidewall of the channel pillar structure, and the forming a word line structure comprises:

forming an initial word line structure, wherein the initial word line structure is located on a top surface of the first dielectric layer, a top surface of the first isolation layer, and a bottom surface of the protective layer; and patterning the initial word line structure by using the protective layer as a mask, until the top surface of the first isolation layer is exposed, wherein the retained initial word line structure is taken as the word line structure.

8. The method of manufacturing the semiconductor structure according to claim 7, wherein the partially removing the filling layer comprises:

removing a part of the filling layer before the substrate is patterned; and removing a part of the filling layer after the protective layer is formed and before the initial word line structure is formed.

9. The method of manufacturing the semiconductor structure according to claim 7, wherein the forming an isolation structure comprises:

forming a first isolation structure, wherein the first isolation structure is located on the top surface of the first isolation layer, a sidewall of the word line structure, and a sidewall of the protective layer, and the first isolation structure and the protective layer form the isolation structure.

10. The method of manufacturing the semiconductor structure according to claim 1, wherein the forming a protective layer comprises:
  forming a first protective layer, wherein the first protective layer is located on a top surface of the substrate; and
  forming a second protective layer, wherein the second protective layer is located on a sidewall of the first protective layer, and on a top surface of the second groove, and the first protective layer and the second protective layer form the protective layer.

11. The method of manufacturing the semiconductor structure according to claim 10, further comprising: a first dielectric layer, wherein the first dielectric layer is located on the top surface of the bit line structure and on a sidewall of the channel pillar structure, and the forming word line structures comprises:
  removing a part of the first dielectric layer and the filling layer in a same step, such that a top surface of the first dielectric layer is flush with the upper surface of the first isolation layer;
  forming a second dielectric layer, wherein the second dielectric layer is located on the top surface of the first dielectric layer and covers a part of the sidewall of the channel pillar structure;
  forming an initial word line structure, wherein the initial word line structure fills up the first groove and the second groove; and a top surface of the initial word line structure is flush with a bottom surface of the first protective layer; and
  patterning the initial word line structure and the first isolation layer by using the protective layer as a mask, until the top surface of the bit line structure is exposed, wherein the retained initial word line structure is taken as the word line structure.

12. The method of manufacturing the semiconductor structure according to claim 10, wherein the forming an isolation structure comprises:
  forming a first isolation structure and a second isolation structure, wherein the first isolation structure is an air gap enclosed by the first isolation layer, the word line structure, and the second isolation structure, the second isolation structure is located between adjacent two of the word line structures, and a top surface of the second isolation structure is flush with a top surface of the word line structure.

13. The method of manufacturing the semiconductor structure according to claim 1, wherein the forming a bit line structure comprises:
  forming a fourth groove, wherein the fourth groove is located on a bottom surface of the second groove;
  forming a first bit line conductive layer through a metal silicide process, wherein the first bit line conductive layer is located on a surface of the fourth groove facing the substrate; and
  forming a second bit line conductive layer, wherein the second bit line conductive layer fills up the fourth groove, and the first bit line conductive layer and the second bit line conductive layer form the bit line structure.

* * * * *